United States Patent [19]
Ni

[11] Patent Number: 6,150,244
[45] Date of Patent: Nov. 21, 2000

[54] METHOD FOR FABRICATING MOS TRANSISTOR HAVING RAISED SOURCE AND DRAIN

[75] Inventor: Cheng-Tsung Ni, Hsinchu, Taiwan

[73] Assignee: Mosel Vitelic Inc., Taiwan

[21] Appl. No.: 09/467,086

[22] Filed: Dec. 10, 1999

[51] Int. Cl.$^7$ .................................................. H01L 21/22
[52] U.S. Cl. .......................................... 438/564; 438/300
[58] Field of Search ................................... 438/300, 299, 438/301, 303, 530, 542, 595, 564, 561

[56] References Cited

U.S. PATENT DOCUMENTS

| | | | |
|---|---|---|---|
| 4,072,545 | 2/1978 | De La Moneda | 438/300 |
| 5,773,358 | 6/1998 | Wu et al. | 438/564 |
| 5,869,375 | 2/1999 | Choi et al. | 438/300 |
| 5,930,616 | 7/1999 | Dennison | 438/564 |

*Primary Examiner*—Charles Bowers
*Assistant Examiner*—Jack Chen
*Attorney, Agent, or Firm*—Heller Ehrman White & McAuliffe

[57] ABSTRACT

A process for fabricating a semiconductor device comprising a raised source and drain. A semiconductor device is fabricated by a process comprising the following steps: forming active regions separated by isolation regions; forming at each active region a gate electrode structure; depositing a first dielectric layer and a second dielectric layer; removing the top portion of the second dielectric layer to expose the portion of the first dielectric layer that covers the gate electrode structure; forming on the substrate a patterned resist layer to mask portions of the second dielectric layer; forming trenches next to the gate electrode structure by removing the unmasked portions of the second dielectric layer; filling the trenches with a conductor; doping the conductor with dopants; and driving the dopants into the substrate to form the raised source and drain.

20 Claims, 4 Drawing Sheets

METHOD FOR FABRICATING MOS TRANSISTOR HAVING RAISED SOURCE AND DRAIN

BACKGROUND OF THE INVENTION

1. Field of the Invention

This invention relates generally to processes for fabricating semiconductor transistors, and in particular to a new process for fabricating metal oxide semiconductor transistors having raised source and drain electrodes.

2. Description of the Prior Art

Semiconductor devices are constantly being miniaturized. As the overall dimensions of semiconductor devices are made smaller and smaller, the formation of very shallowly doped regions, i.e., "shallow junctions," becomes a major limiting factor in the fabrication of semiconductor devices having metal oxide semiconductor field-effect transistors (MOSFETs) and complementary metal oxide semiconductor (CMOS) components. Shallow junctions, when properly formed, mitigate various undesirable effects caused by short channels, leakage current, and contact or sheet resistance.

Technical difficulties have plagued the formation of shallow junctions. For example, in the case of p junctions, the typical dopant is boron, which has a low atomic number (Z) of 5. On the one hand, during a conventional ion implantation process, low-Z dopant ions tend to channel through the crystalline structure of the semiconductor substrate and form an undesirable implantation profile with a deep tail, where the concentration and depth of the dopant ions easily extend beyond the desirable channel depth. On the other hand, low-energy ion implantation techniques (with energy less than 5 KeV) pose a separate set of problems: the size and direction of low-energy ion beams are difficult to control; low-energy ions tend to sputter, deposit or diffuse randomly instead of penetrating the substrate surface region; low-energy ion implanters are both difficult and expensive to make; and so on.

The use of raised source and drain has recently been proposed as an alternative technique for forming a shallow junction in a semiconductor transistor. Thus, landing pads are first formed at the surface regions of the substrate where the source and the drain are to be formed; meanwhile, a resist mask protects the active region where the gate electrode is to be formed. Dopant ions are then implanted in the pads through a conventional ion implantation process. The implanted dopant ions are made to diffuse, typically by way of thermal treatment, into the designated substrate surface regions to form the raised source and drain. Subsequently, the protective resist mask is removed, and the gate electrode is formed at the active region. Finally, various other elements of the semiconductor devices, such as the conductors and the dielectric layers, are sequentially formed on the substrate to complete the fabrication of the semiconductor transistor.

Although the inclusion of raised source and drain has made it possible to fabricate semiconductor transistors with shallow junctions, the constant miniaturization of semiconductor devices dictates that other improvements be made to both device structures and fabrication techniques relating to the formation of raised source and drain. For example, as the lithographic line width is reduced to 0.25 µm or smaller (i.e., sub-quarter-micron or deep sub-micron), it becomes more and more difficult to control the critical dimensions of the semiconductor devices through conventional exposure and etching schemes. Device miniaturization also reduces the tolerance for diffusion caused by thermal treatment, and places great strain on the device planarization requirement particularly when such devices include raised sources and drains. In short, the mere use of raised source and drain taught in the conventional art is insufficient to cope with all the problems associated with the fabrication of ever-shrinking semiconductor devices. Hence there is plenty of room for improvement in the fabrication of metal oxide semiconductor devices having raised source and drain electrodes.

SUMMARY OF THE INVENTION

Accordingly, it is an object of the present invention to provide a new metal-oxide semiconductor (MOS) processing method that facilitates the formation of raised source and drain electrodes to overcome shallow-junction-related problems.

Another object of the present invention is to provide a method for fabricating MOS transistors having raised sources and drains in spite of the trend of miniaturization of such transistors.

Still another object of the present invention is to provide MOS transistors having sources and drains that can be fabricated by deep sub-micron semiconductor processes.

In accordance with the objects described above, the present invention provides a method of fabricating a MOS transistor having a junction composed of a raised source electrode and a raised drain electrode, which method include the following processing steps:

Forming on a substrate a plurality of isolation regions defining an active region;

forming a lightly doped well in the substrate;

forming sequentially a first dielectric layer, a first conductor layer and a second dielectric layer on the substrate;

forming at the active region a patterned first resist layer masking a portion of the second dielectric layer and the underlying first conductor layer and first dielectric layer;

forming a gate electrode structure by removing the unmasked portions of the second dielectric layer and the underlying first conductor layer and first dielectric layer;

depositing sequentially a third dielectric layer and a fourth dielectric layer on the substrate;

exposing the portion of the third dielectric layer covering the gate electrode structure by planarizing the top portion of the fourth dielectric layer;

forming on the substrate a patterned second resist layer masking portions of the fourth dielectric layer;

forming two trenches adjacent to the gate electrode structure by removing the unmasked portions of the fourth dielectric layer;

filling the trenches by depositing a second conductor layer on the substrate;

exposing the gate electrode structure by removing excessive portions of the second conductor layer;

doping the ohmically unconnected, conductor-filled trenches with dopants; and forming the raised source and drain electrodes by thermally driving the dopants into the surface regions of the well underneath the trenches.

Essentially, the MOS fabrication process disclosed herein has the following significant advantages over those taught in the conventional art:

An advantage of the present invention is that processing problems typically associated with gate formation in the presence of rather delicate source and drain regions are circumvented because the gate electrode of the present invention is formed before the source and drain electrodes;

Another advantage of the present invention is that it is more compatible with deep sub-micron semiconductor processes than the conventional art because the definition of the raised source and drain in the present invention is not dependent upon a single high-resolution lithographic step.

Still another advantage of the present invention is that no conventional landing pads are needed in the formation of the raised source and drain.

These and other objects, features and advantages of the present invention will no doubt become apparent to those skilled in the art after reading the following detailed description of the preferred embodiment that is illustrated in the several figures of the drawing.

IN THE DRAWINGS

DETAILED DESCRIPTION OF THE PREFERRED EMBODIMENTS

While the present invention may be embodied in many forms, details of a preferred embodiment are schematically shown in FIGS. 1 through 7, with the understanding that the present disclosure is not intended to limit the invention to the embodiment illustrated.

The MOS fabrication process disclosed herein differs from those taught in the conventional art in at least two critical aspects: (A) the gate electrode of the MOS transistor of the present invention is formed before the source and drain electrodes, thus circumventing those processing problems typically associated with gate formation in the presence of rather delicate source and drain regions; and (B) the definition of the raised source and drain of the present invention does not rely on the use of a single lithographic step, thus greatly reducing the line width constraint on the resist and making the present invention more compatible with deep sub-micron semiconductor processes.

Figure 1:
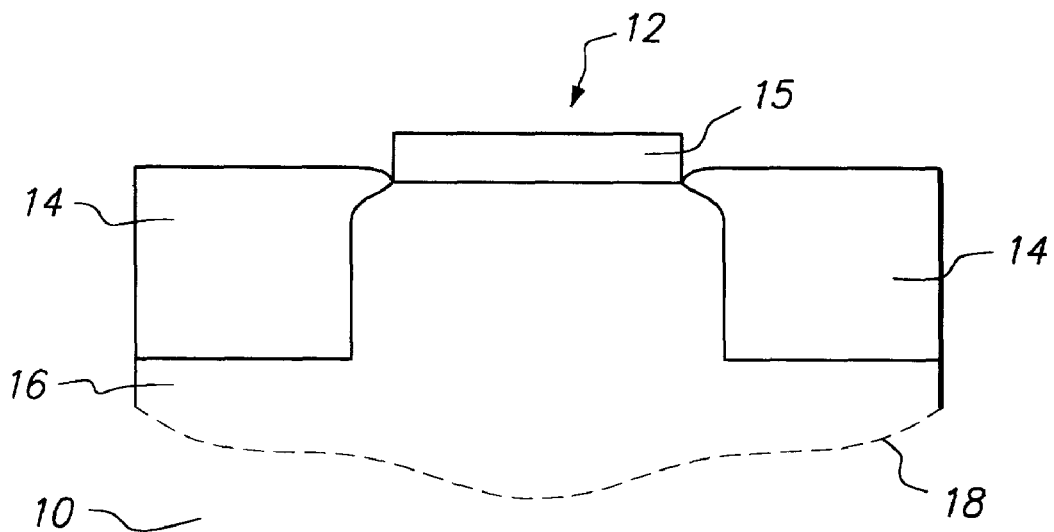
FIG. 1 is a schematic, cross-sectional representation of the MOS transistor of the present invention after the formation of the isolation regions.

In accordance with a specific embodiment of the present invention, isolation regions 14 are first formed at the surface of a semiconductor substrate 10 to define active regions 12 for the semiconductor transistors to be fabricated; see FIG. 1. The isolation regions 14 may be field oxide (FOX) regions formed by the oxidation of selected portions of the surface of the substrate 10. A typical manufacturing process for making these FOX regions is the local oxidation of silicon (LOCOS) process. In this process, comparatively thick oxide layers partly or wholly inset in the silicon substrate are obtained through the use of an oxidation-resistant silicon-nitride-containing masking layer. Alternatively, the isolation regions 14 may be formed by other schemes known in the prior art such as trench isolation or shallow trench isolation. Also shown in FIG. 1 is a patterned resist layer 15, which serves the function of defining the boundaries between an active region 12 and its adjacent isolation regions 14 during the formation of the isolation regions.

After the isolation regions 14 are formed, dopants are typically implanted into the substrate 10 to form a lightly doped well region 16. The types and concentrations of the dopants depend upon the type of the well (p or n) and the desirable level of electron carriers in the well. Because these dopants penetrate deeper in the substrate 10 than in the isolation regions 14, the well region 16 shown in FIG. 1 has a profile 18 that is convex under the active region 12 toward the bottom of the substrate.

Figure 2:
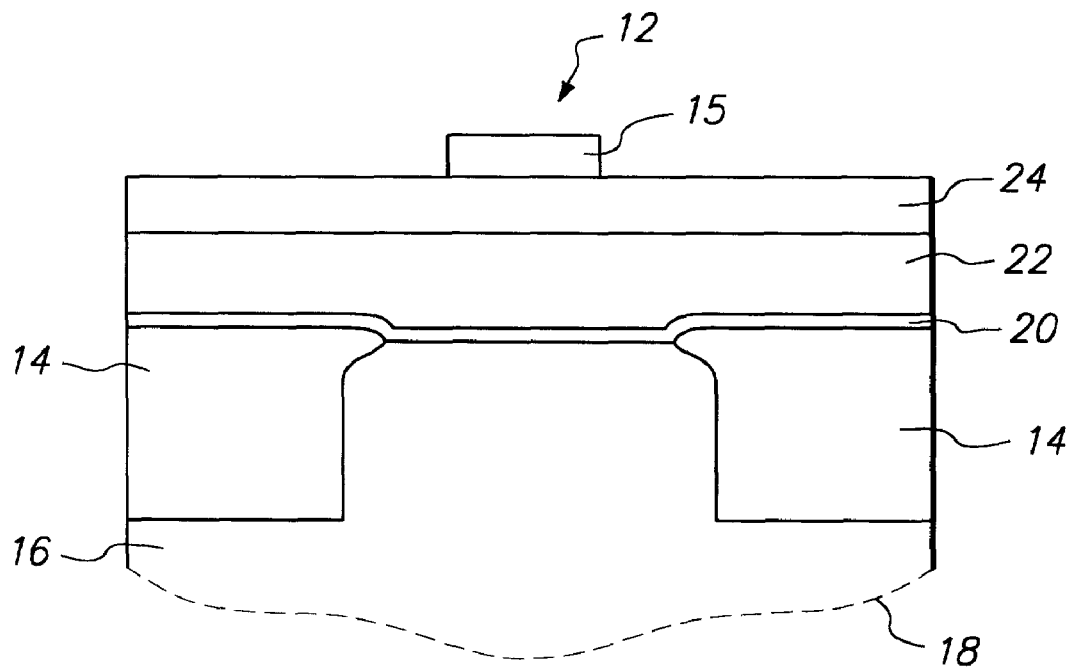
FIG. 2 is a schematic, cross-sectional representation of the MOS transistor of the present invention after the deposition of the first dielectric layer, the first conductor layer and the second dielectric layer and the formation of the patterned first resist layer.

Next, as shown in FIG. 2, a first dielectric layer 20, a first conductor layer 22 and a second dielectric layer 24 are sequentially formed on top of the substrate 10. Typically, the first dielectric layer 20 is a silicon oxide, silicon nitride or silicon oxynitride ($SiO_xN_y$) layer formed by a thermal or chemical vapor deposition (CVD) process, the first conductor layer 22 is a polysilicon formed by a CVD process, and the second dielectric layer 24 is a silicon nitride or silicon oxynitride layer formed by a CVD process. Alternatively, the first dielectric layer 24 can be $Ta_2O_5$, $Al_2O_3$, $TiO_2$, $ZrO_2$, or $HfO_2$, and the first conductor layer 22 can be $\alpha$-Si, WSi, W or other metals, or polycide. The typical thickness of the first dielectric layer 20, the first conductor layer 22 and the second dielectric layer 24 are, respectively, 20 nm, 5–20 nm and 150 nm. As described below, these three layers 20, 22 and 24 will relate to a gate electrode structure (shown below), with the second dielectric layer 24 serving as the masking layer protecting the integrity of this gate electrode structure during a subsequent etching step.

A patterned first resist layer 25 is then formed on top of the substrate at approximately the center of the active region 12. As shown below, this first resist layer 25 helps to define a gate electrode structure as well as the location of the raised source and the drain for the transistor.

After the first resist layer 25 is patterned, portions of the second dielectric layer 24 and their underlying first conductor layer 22 and first dielectric layer 20 that are not masked by the first resist layer 25 are removed by an anisotropic etching process using, e.g., fluorine or chlorine plasma. The remaining portions of the three layers 20, 22 and 24 together form a gate electrode structure 27 (shown in FIG. 3) underneath the first resist layer 25. The first resist layer 25 is then stripped.

Figure 3:
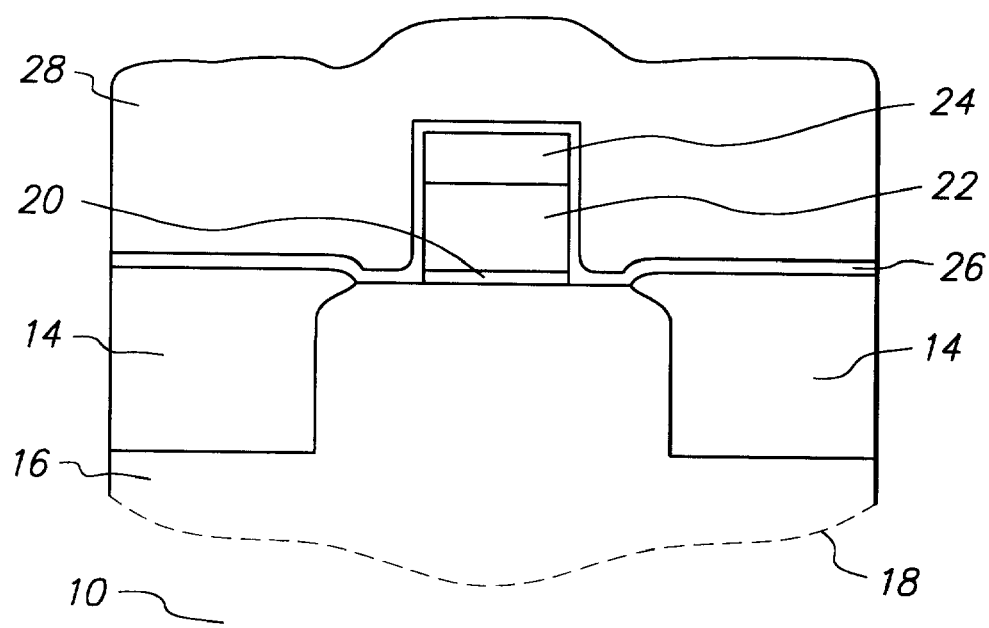
FIG. 3 is a schematic, cross-sectional representation of the MOS transistor of the present invention after the formation of the gate electrode structure and the deposition of the third and the fourth dielectric layers.
Figure 4:
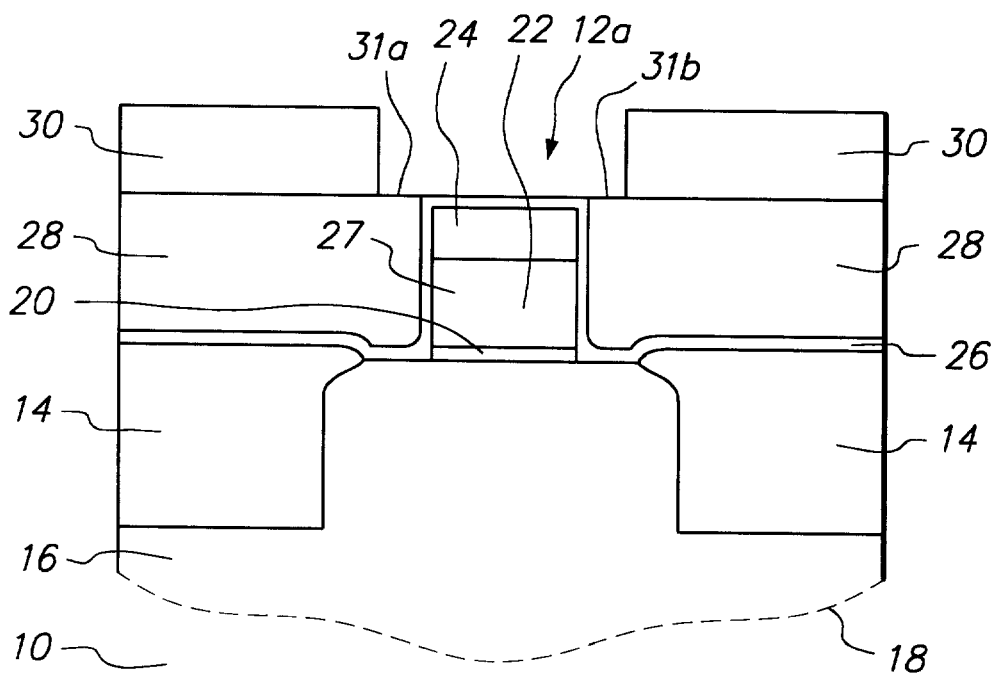
FIG. 4 is a schematic, cross-sectional representation of the MOS transistor of the present invention after the planarization of the fourth dielectric layer and the formation of the patterned second resist layer.

Next, as shown in FIG. 3, a third dielectric layer 26 is deposited on the surfaces of the substrate 10 and the gate electrode structure 27. Typically, this third dielectric layer 26 is a 5–50 nm-thick silicon oxide, silicon nitride, or silicon oxynitride layer formed by a CVD process. This dielectric layer 26 will serve as an etch-stop layer in a subsequent etching step. A fourth dielectric layer 28 is then formed on top of third dielectric layer 26. Typically, this fourth dielectric layer 28 is a silicon oxide layer formed by CVD, and its thickness is, at a minimum, equal to the height of the gate electrode structure 27, which is now covered by the relatively thin third dielectric layer 26. The top portion of the fourth dielectric layer 28 is then planarized by a planarization process, e.g., chemical mechanical polishing (CMP), until the third dielectric layer 26 covering the top of the gate electrode structure 27 is exposed, as shown in FIG. 4.

Next, a second resist layer 30 is deposited on top of the fourth dielectric layer 28 and the exposed third dielectric layer 26. The as-deposited resist layer 30 is then pattered to expose a region 12a on the surface of the entire structure. Significantly, in the present invention, the resist layer 30 does not cover the gate electrode structure 27, in contrast to the conventional scheme wherein a resist is deposited and patterned so as to cover the area of the structure that is not to be etched. Equally important, the exposed region 12a encompasses not only the top surface of the gate electrode structure 27 (as covered by a portion of the third dielectric layer 26) but also areas 31a and 31b of the fourth dielectric layer 28, which areas will define the location of the raised source and drain electrodes, as described below.

Next, an anisotropic etching process using, e.g., fluorine plasma as the etchant, is utilized to remove the unmasked fourth dielectric layer 28 located under areas 31a and 31b. This anisotropic process also removes the portion of the third dielectric layer 26 on top of the gate electrode structure 27. The second resist layer 30 is then removed, resulting in the structure shown in FIG. 5. Two trenches 32a and 32b, the depth of which is approximately the height of the gate electrode structure 27 (now having remnant third dielectric layers 26 covering the sides), are formed next to the gate electrode structure as a result of this anisotropic etching process. As shown below, these two trenches will be employed in the formation of the raised source and drain electrodes of the transistor. The gate electrode structure 27 is no longer covered by the third dielectric layer 26 on the top after the anisotropic etching process; nevertheless, even though this gate electrode structure 27 was not masked by a resist during the aforesaid etching process, it remains intact during such etching, thanks to the presence of the second dielectric layer 24.

Figure 5:
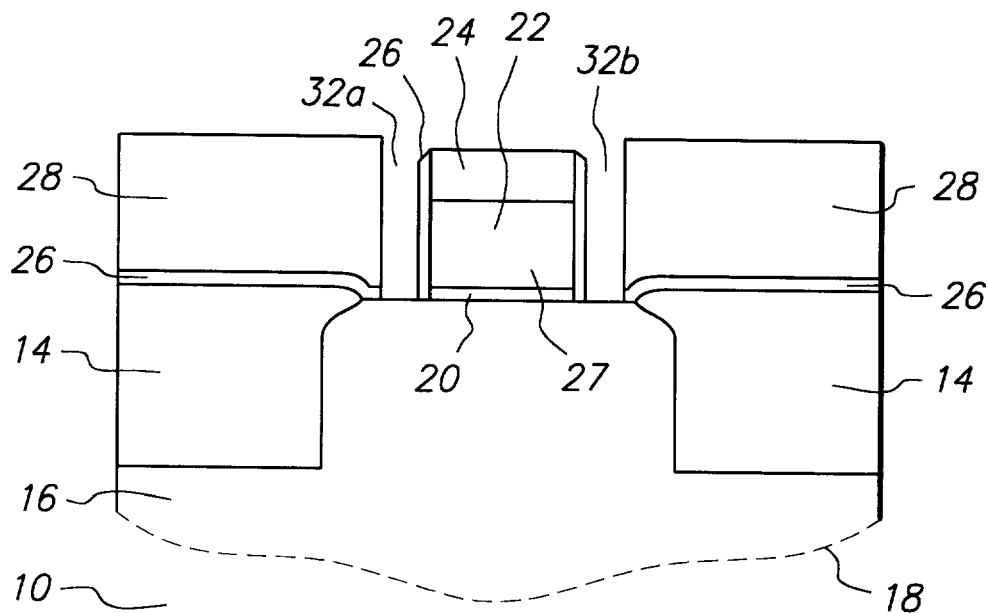
FIG. 5 is a schematic, cross-sectional representation of the MOS transistor of the present invention after the formation of the trenches and the removal of the second resist layer.
Figure 6:
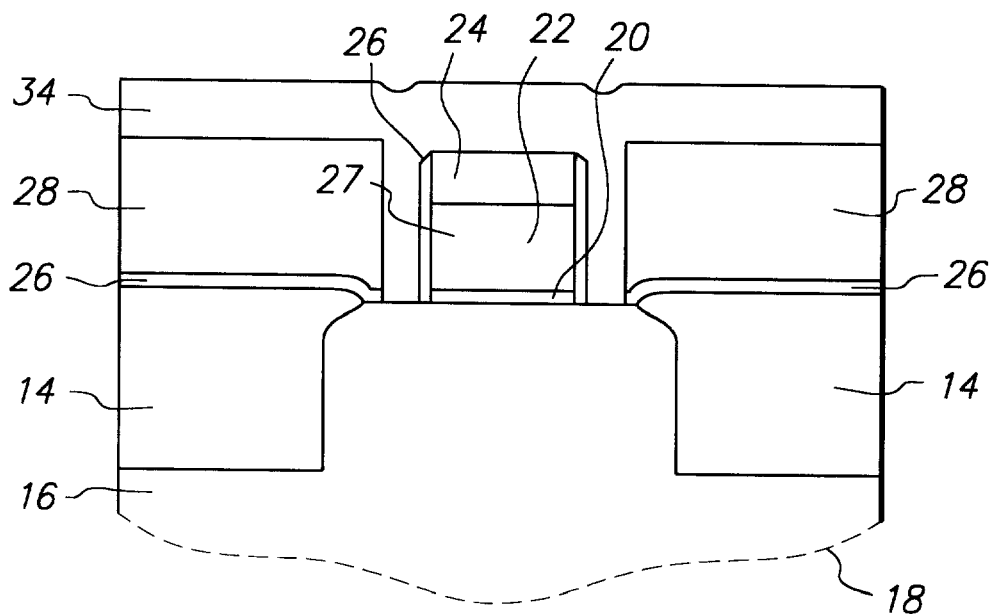
FIG. 6 is a schematic, cross-sectional representation of the MOS transistor of the present invention after the deposition of the second conductor layer.
Figure 7:
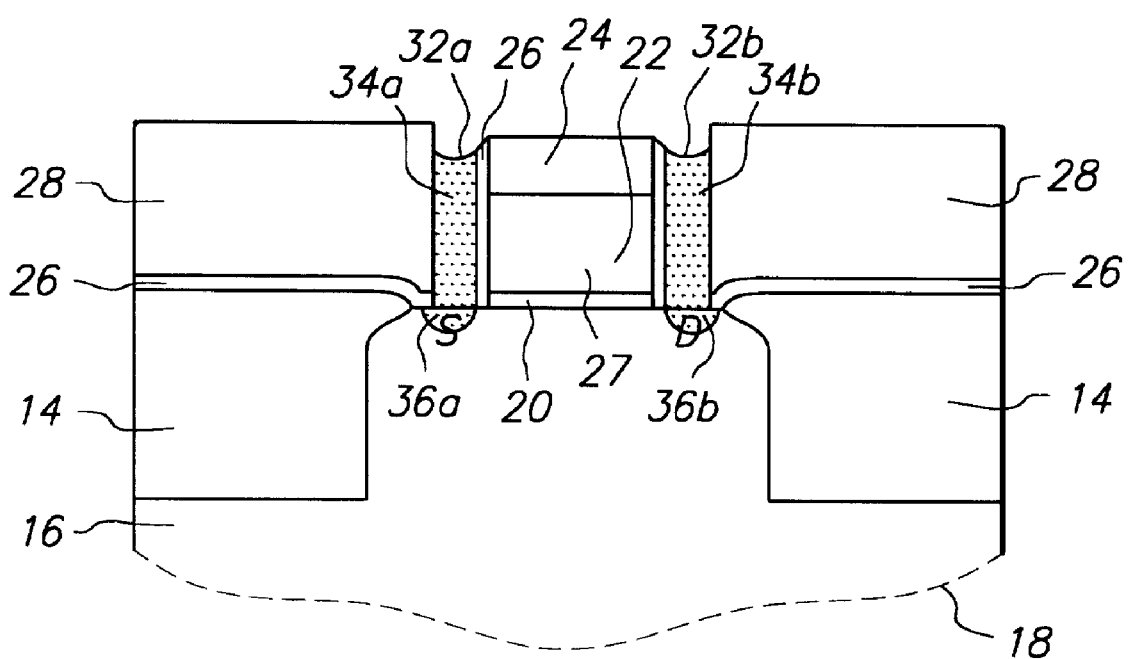
FIG. 7 is a schematic, cross-sectional representation of the MOS transistor of the present invention after the formation of the raised source and drain electrodes.

Next, in FIG. 6, a second conductor layer 34 is deposited on top of the structure of FIG. 5 to fill the trenches 32a and 32b as well as cover the fourth dielectric layer 28 and the gate electrode structure 27. This second conductor layer 34 typically is a metallic or polysilicon layer formed by a CVD or physical vapor deposition (PVD) process, and preferably is a CVD polysilicon layer. The bulk of the as-deposited second conductor layer 34 is then removed by either a CMP process or an etch-back step, such that the gate electrode structure 27 and the fourth dielectric layer 28 are again exposed; see FIG. 7. After such CMP or etch-back process, the two trenches 32a and 32b are filled with conducting materials 34a and 34b, respectively, that originate from the previously deposited second conductor layer 34. These conductor-filled trenches are ohmically unconnected with each other. In the particular embodiment shown in FIG. 7, the filled trenches have concave surfaces as a result of the etch-back of the second conductor layer 34.

Finally, dopant impurities requisite for the formation of the source and drain of the transistor are implanted into the conductor-filled trenches 32a and 32b. Depending on the type of the MOS elements being fabricated (i.e., NMOS vs. PMOS), a mask (e.g., photoresist) is used to cover either the PMOS portions of the substrate when N+ ions are implanted to form NMOS elements, or the NMOS portions of the substrate when P+ ions are implanted to form PMOS elements. This ion implantation step is followed by an annealing process, which: (i) helps to distribute the impurities uniformly within the conductors 34a and 34b, and (ii) makes the impurities diffuse into those areas of the well region 16 directly under the two trenches 32a and 32b, thus forming the raised source 36a and the raised drain 36b of the semiconductor transistor of the present invention. This annealing process may be conducted in a conventional furnace. Alternatively, to avoid undesirable side effects caused by prolonged annealing (e.g., phase change in the conductor material), rapid thermal processing (RTP) may be utilized. Typically, annealing in a conventional furnace is conducted at approximately 850° C. for 15 to 30 minutes, whereas, preferably, annealing by RTP is conducted at approximately 1000° C. for approximately 10 seconds.

While the invention has been particularly shown and described with reference to the above preferred embodiment, it will be understood by those skilled in the art that many other modifications and variations may be made thereto without departing from the broader spirit and scope of the invention as set forth in the claims. The specification and drawings are accordingly to be regarded as an illustrative, rather than restrictive.

What is claimed is:

1. A process of fabricating on a substrate a semiconductor device having a raised source, a raised drain and a gate electrode structure, comprising the steps of:

forming a plurality of isolation regions on said substrate to isolate a plurality of active regions;

forming sequentially a first dielectric layer, a first conductor layer and a second dielectric layer on said substrate;

forming on one of said active regions a patterned first resist layer to mask a portion of said second dielectric layer and the underlying first conductor layer and first dielectric layer;

removing said second dielectric layer, said first conductor layer and said first dielectric layer other than said portion masked by said first resist layer to form said gate electrode structure;

depositing sequentially a third dielectric layer and a fourth dielectric layer on said substrate and said gate electrode structure;

removing a top portion of said fourth dielectric layer to expose a portion of said third dielectric layer covering said gate electrode structure;

forming on the substrate a patterned second resist layer to mask portions of the fourth dielectric layer;

removing said fourth dielectric layer other than said portions masked by said second resist layer to form a plurality of trenches adjacent to said gate electrode structure, wherein portions of the substrate are exposed, and wherein spacers are formed on sidewalls of the gate electrode structure at the same time;

filling said plurality of trenches with a second conductor layer, doping said second conductor layer in the trenches with dopants; and driving said dopants into the substrate underneath said trenches to form said raised source and said raised drain.

2. The process of claim 1, further comprising the step of forming a lightly doped well in said substrate between said step of formation of the isolation regions and said step of formation of the first dielectric layer.

3. The process of claim 2, wherein said isolation regions are field oxide regions.

4. The process of claim 3, wherein said step of filling trenches comprises two consecutive steps of:
   depositing a second conductor layer on said substrate; and
   removing said second conductor layer other than portions filling said trenches.

5. The process of claim 4, wherein said step of formation of the raised source and raised drain is carried out in a furnace by annealing.

6. The process of claim 4, wherein said step of formation of the raised source and raised drain is a rapid thermal processing step.

7. The process of claim 4, wherein said step of formation of the gate electrode structure is an anisotropic etching step.

8. The process of claim 4, wherein said step of removing of the second conductor layer is an anisotropic etching step.

9. The process of claim 1, wherein said first dielectric layer is a CVD silicon oxide layer.

10. The process of claim 1, wherein said second dielectric layer is a CVD silicon nitride layer.

11. The process of claim 1, wherein said third dielectric layer is a CVD silicon nitride layer.

12. The process of claim 1, wherein said fourth dielectric layer is a CVD silicon oxide layer.

13. The process of claim 1, wherein said second conductor layer is a CVD polysilicon layer.

14. A process of fabricating on a substrate a semiconductor device having a raised source, a raised drain and a gate electrode structure, comprising the steps of:
   forming a plurality of isolation regions on said substrate to isolate a plurality of active regions;
   forming on one of said active regions a gate electrode structure;
   depositing sequentially a first dielectric layer and a second dielectric layer on said substrate and said gate electrode structure;
   removing a top portion of said second dielectric layer to expose a portion of said first dielectric layer covering said gate electrode structure;
   forming on said substrate a patterned resist layer to mask portions of said second dielectric layer;
   removing said second dielectric layer other than said portions masked by said resist layer to form a plurality of trenches adjacent to said gate electrode structure, wherein portions of the substrate are exposed, and wherein spacers are formed on sidewalls of the gate electrode structure at the same time;
   filling said plurality of trenches with a first conductor layer;
   doping said first conductor layer in the trenches with dopants; and
   driving said dopants into portions of said substrate underneath said trenches to form said raised source and said raised drain.

15. The process of claim 14, wherein said step of trench filling trenches comprises two consecutive steps of:
   depositing a first conductor layer on said substrate; and
   removing said first conductor layer other than portions filling said trenches.

16. A semiconductor device having a raised source, a raised drain and a gate electrode structure, fabricated on a substrate by a process comprising the steps of:
   forming a plurality of isolation regions on said substrate to isolate a plurality of active regions;
   forming sequentially a first dielectric layer, a first conductor layer and a second dielectric layer on said substrate;
   forming on one of said active regions a patterned first resist layer to mask a portion of said second dielectric layer and the underlying first conductor layer and first dielectric layer;
   removing said second dielectric layer, said first conductor layer and said first dielectric layer other than said portion masked by said first resist layer to form said gate electrode structure;
   depositing sequentially a third dielectric layer and a fourth dielectric layer on said substrate and said gate electrode structure;
   planarizing a top portion of said fourth dielectric layer to expose a portion of said third dielectric layer covering said gate electrode structure;
   forming on the substrate a patterned second resist layer to mask portions of the fourth dielectric layer;
   removing said fourth dielectric layer other than said portions masked by said second resist layer to form a plurality of trenches adjacent to said gate electrode structure, wherein portions of the substrate are exposed, and wherein spacers are formed on sidewalls of the gate electrode structure at the same time;
   filling said plurality of trenches with a second conductor layer;
   doping said second conductor layer in the trenches with dopants; and
   driving said dopants into the substrate underneath said trenches to form said raised source and said raised drain.

17. The process of claim 16, further comprising the step of forming a lightly doped well in said substrate between said step of formation of the isolation regions and said step of formation of the first dielectric layer.

18. The process of claim 17, wherein said step of filling trenches comprises two consecutive steps of:
   depositing a second conductor layer on said substrate; and
   removing said second conductor layer other than portions filling said trenches.

19. The semiconductor device of claim 16, wherein said semiconductor device is a MOSFET.

20. The semiconductor device of claim 16, wherein said semiconductor device is a MOS transistor.

* * * * *